United States Patent
Mirsky et al.

(10) Patent No.: US 10,193,326 B2
(45) Date of Patent: Jan. 29, 2019

(54) NON-INTRUSIVE SHORT-CIRCUIT PROTECTION FOR POWER SUPPLY DEVICES

(71) Applicant: Continental Automotive Systems, Inc., Auburn Hills, MI (US)

(72) Inventors: Gregory Mirsky, Buffalo Grove, IL (US); Larry A. Sparling, Buffalo Grove, IL (US); Jonathan T. Klister, Round Lake, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 292 days.

(21) Appl. No.: 15/134,603

(22) Filed: Apr. 21, 2016

(65) Prior Publication Data

US 2017/0310099 A1    Oct. 26, 2017

(51) Int. Cl.
| | |
|---|---|
| *H02H 3/20* | (2006.01) |
| *H03K 17/16* | (2006.01) |
| *H03K 17/20* | (2006.01) |
| *H03K 5/04* | (2006.01) |
| *H03K 5/24* | (2006.01) |
| *H02H 3/087* | (2006.01) |
| *H02H 7/20* | (2006.01) |

(52) U.S. Cl.
CPC .............. *H02H 3/20* (2013.01); *H02H 3/087* (2013.01); *H02H 7/20* (2013.01); *H03K 5/04* (2013.01); *H03K 5/2463* (2013.01); *H03K 17/165* (2013.01); *H03K 17/20* (2013.01)

(58) Field of Classification Search
CPC ............ H02H 3/087; H02H 3/20; H02H 7/20; H03K 5/04; H03K 5/2463; H03K 17/165; H03K 17/20
USPC ........................................................ 361/86
See application file for complete search history.

(56) References Cited

U.S. PATENT DOCUMENTS

| | | | |
|---|---|---|---|
| 4,819,117 A | 4/1989 | Brennan et al. | |
| 7,012,405 B2 * | 3/2006 | Nishida | H02J 7/0073 320/137 |
| 7,660,091 B2 * | 2/2010 | Nakajima | H03K 17/18 361/103 |
| 8,422,183 B2 | 4/2013 | Ohshima | |
| 8,488,648 B2 | 7/2013 | Lim et al. | |
| 2010/0225290 A1 | 9/2010 | Nalbant | |

FOREIGN PATENT DOCUMENTS

| | | |
|---|---|---|
| JP | 1996009687 | 1/1996 |
| KR | 1019960703265 | 12/2008 |
| KR | 1020080112085 | 12/2008 |

OTHER PUBLICATIONS

International Search Report and the Written Opinion of the International Searching Authority dated May 19, 2017 for the corresponding PCT application No. PCT/US2016/067230.

\* cited by examiner

*Primary Examiner* — Kevin J Comber

(57) ABSTRACT

Non-ideal diodes have a non-zero resistance across a PN junction when the junction is forward biased. When a diode comprising a power supply has a voltage drop across the junction that exceeds a predetermined threshold, the threshold-exceeding voltage drop trips a comparator, the output of which controls a switch between a power supply and a load.

16 Claims, 3 Drawing Sheets

NON-INTRUSIVE SHORT-CIRCUIT PROTECTION FOR POWER SUPPLY DEVICES

BACKGROUND

As used herein, the term "short circuit" refers to an abnormal connection of zero or relatively low impedance between live conductors having a difference in potential under normal operating conditions. A short circuit current is an over current, or more current than normal, which goes outside a normal current path when the current is shunted around a load.

Those of ordinary skill in the art know that a power supply is a device that provides electrical current to a load device. Many power supplies provide a direct current or "D.C." In a motor vehicle, a power supply is frequently embodied as a battery capable of providing significantly more electric current than the electronic devices commonly found throughout a vehicle require. A mechanism for protecting a battery or other type of power supply device from short-circuits is thus important to both the vehicle and various devices that are provided power.

Prior art short-circuit protective devices for electronic circuitry and devices typically use a small-valued resistance through which all of the current to an electronic load device is provided. The amount of current provided to such a load is determined by measuring the voltage drop across the small-valued resistance and, using Ohm's Law, calculating the current through the resistance. Those of ordinary skill in the art know that such a determination is made by dividing the voltage drop across the resistance by the value of the resistance itself.

Problems with prior art short-circuit protection devices that require a current-sensing resistor include the cost of a precision resistance, and a device to measure the voltage drop and cut off current when the voltage drop exceeds some pre-determined value. A more direct, simpler and less expensive method and apparatus for providing short-circuit protection to power supply devices would be an improvement over the prior art.

DETAILED DESCRIPTION

A diode is a semi-conductor electronic device having two electrodes or terminals and which is often used as a rectifier. A diode can also be used to limit or control the direction in which current flows in a circuit. In this disclosure, the voltage drop across a forward-biased diode junction is used to provide a non-intrusive short-circuit protection to power supply devices.

Those of ordinary skill in the art know that an ideal diode is a device that limits the direction in which electric current can flow but which has no voltage drop across the P-type semi-conductor material and N-type semi-conductor material from which a diode is made. A non-ideal diode, however, has a non-zero resistance, which is also non-linear. Stated another way, a non-zero resistance exists between the N-type semi-conductor material comprising a cathode and the P-type material comprising the diode's anode.

Figure 1:
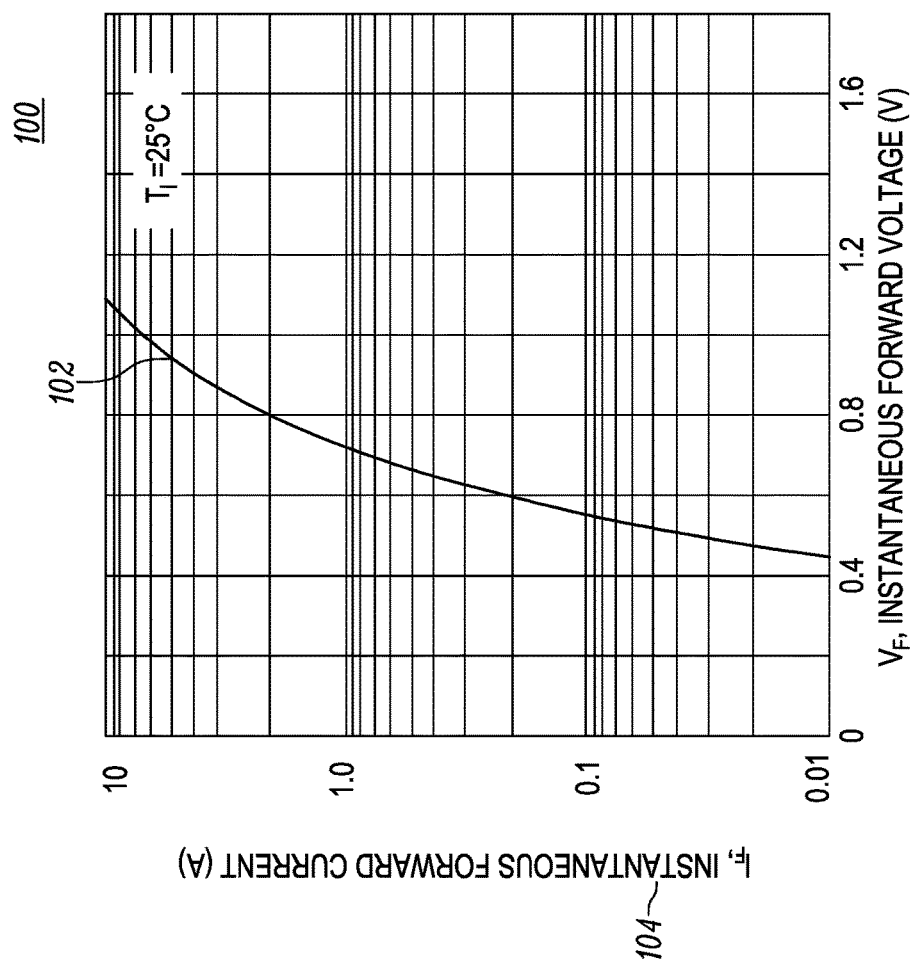
FIG. 1 is a prior art graph of the instantaneous forward-biased voltage of a diode as a function of the instantaneous forward current.

As shown in FIG. 1, the instantaneous forward-bias voltage across a PN junction varies continuously, but non-linearly, from about 0.4 volts up to about 1.1 volts for currents in the forward direction ranging between about 0.01 amperes and about 10.0 amperes at a junction temperature of about 25 degrees Centigrade. In the apparatus described below, the non-zero resistance across a PN junction of a diode, along with the resistance of copper traces on the board and inductor wire resistance, is used in place of a small-valued current-sensing resistor to determine when the current through the diode should be cut off in order to prevent damage to a power supply device.

Figure 2:
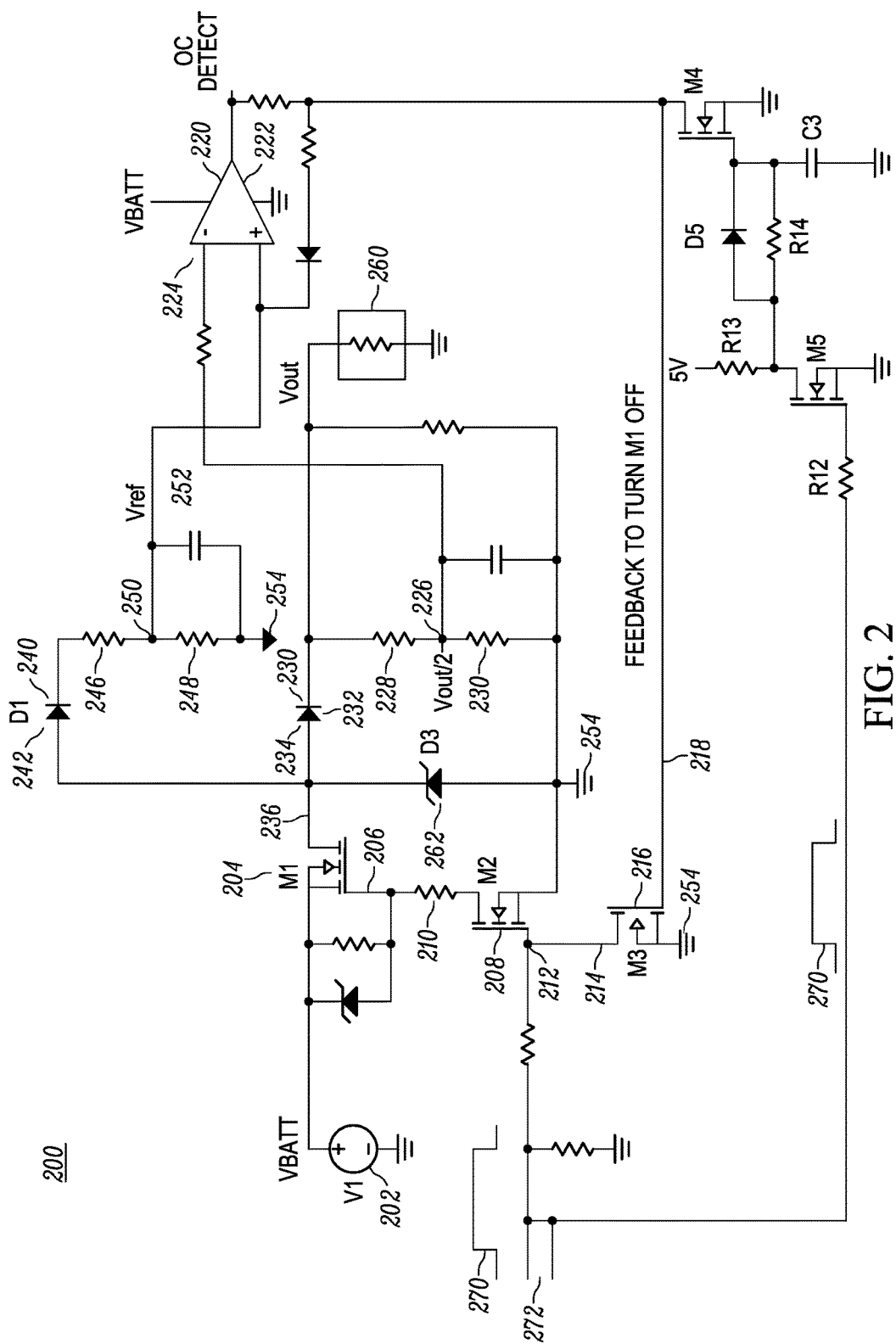
FIG. 2 is a schematic diagram of a preferred embodiment of an apparatus for providing short-circuit protection to a power supply non-intrusively.

FIG. 2 is a schematic diagram of an apparatus that is both non-intrusive and which provides short-circuit protection to a power supply, i.e., a protection circuit 200. The protection circuit 200 is considered to be "non-intrusive" because the components, from which it is made, are also part of a conventional "boost" circuit commonly used in switch-mode power supplies.

Boost circuits are well known to those of ordinary skill in the power supply art. Additional description of them is therefore omitted in the interest of brevity.

In FIG. 2, a power supply device 202 embodied as the vehicle battery is electrically connected to a conventional metal oxide semiconductor field effect transistor (MOSFET) transistor 204, the gate 206 of which is coupled to a second MOSFET 208 through a small value resistance 210. The gate 212 of the second MOSFET 208 is in its turn coupled to the source 214 of a third MOSFET 216, the gate of which 218 is coupled to an output terminal 220 of a conventional voltage comparator 222. The comparator 222 thus controls when the MOSFETs 204, 208 and 216 turn on and off by virtue of the voltage output from the comparator 222.

The comparator 222 has two inputs: a non-inverting input and an inverting input. The inverting input 224 is electrically connected to the output node 226 of a voltage divider comprising two resistors, which are identified in FIG. 2 by reference numerals 228 and 236.

The "input" node of the voltage divider, which is the top node of the first resistor 228, is coupled to the cathode 230 of a first, non-ideal diode 232, the anode 234 of which is coupled to the power source 202 through the first transistor 204. The first transistor 204 is thus considered herein to be a switching device having its input terminal (drain) coupled to the power source. Its output terminal, i.e. the source 236, is coupled directly to the anode 234 of the first diode 232. The gate 206 of the first transistor is a control terminal of the transistor and, as described above, indirectly connected to the output of the comparator 222 through the second and third transistors.

A second non-ideal diode 240 has its anode 242 also coupled to the power source 202 through the same transistor 204. The cathode 244 is connected to a second voltage divider comprising resistors 246 and 248. The node 250 common to both resistors is shunted by a small capacitor 252 to ground potential 254 but otherwise connected directly to the non-inverting input of the comparator 222.

The comparator as depicted in FIG. 2 is provided a uni-polar power supply voltage. It therefore has a uni-polar output voltage. The voltage output 220 of the comparator causes the transistors described above to operatively connect and disconnect the power source 202 from the anodes of both transistors.

Referring again to FIG. 1, those of ordinary skill in the art should recognize that, as current passing through the first diode 232 increases, the voltage drop across it, i.e. the voltage difference between the anode and cathode, also increases, causing the voltage across the load 260 and the node 226 decrease. As the voltage drop across the first diode 232 increases relative to the voltage drop across the other, reference diode 240, the voltage across the inputs 222 and 224 of the comparator 220, will change accordingly, eventually causing the output of the comparator to change state. By appropriately selecting the voltage division factors provided by selecting resistance values of the two voltage dividers, the current passing through the diode 232 can be reduced to zero.

For the sake of completeness, the second transistor 208 enables and disables the circuit shown in FIG. 2, responsive to the voltage input to its gate terminal. A Schottky diode 262 recuperates magnetic energy stored in the boost inductor and inductance of the traces so that at the scheme turn off the node 236 sees a potential close to the ground reference 264.

When the Protection Circuit 200 is in a "RESET mode," the left terminal of the resistor R12 "sees" a low potential, transistor M5 is "off," i.e., not-conducting and its drain has a high potential. Capacitor C3 quickly charges up to almost 5V through R13 and diode D5, thereby turning M4 on and bringing its drain potential to almost zero. The low potential on the drain of the M4 keeps the MOSFET 216 in the OFF state, disabling the feedback to the gate of MOSFET 216 and allowing for the ENABLE high level operate MOSFET 208. At the same time, the low potential on the M4 drain breaks the feedback from the output 228 of comparator 222 to its non-inverting input through resistors R10, R11 and diode D4. This ensures a low potential on the comparator 222 output 228.

When an ENABLE pulse 270 is applied to the input 272 of the protection circuit 200, it turns M5 "on" and initiates a slow discharge of the capacitor C3 through the resistor R14, which turns M4 off with some delay. This delay ensures a reliable activation of the feedback to the gate of the MOSFET 216 when all transient processes are over.

Figure 3:
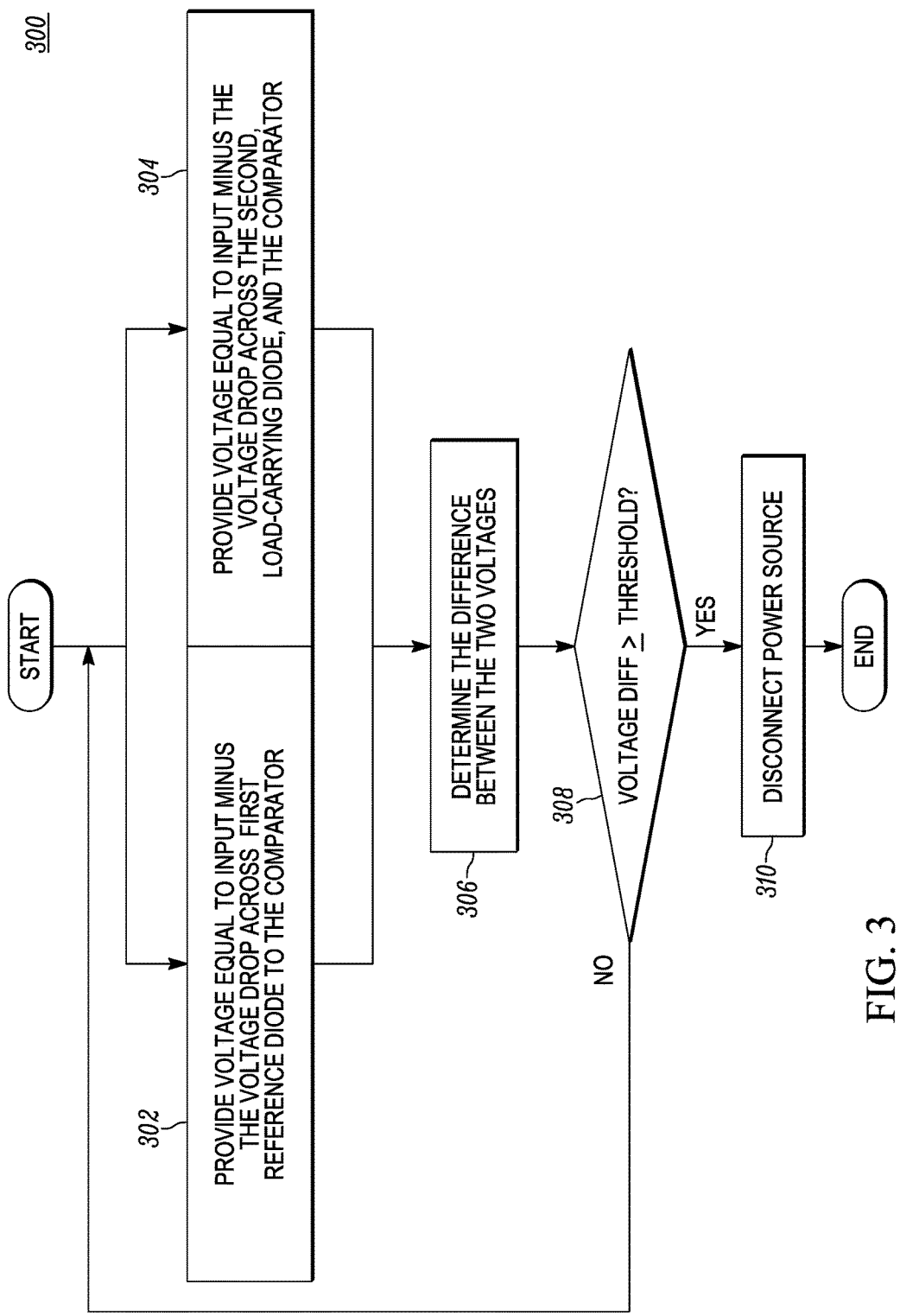
FIG. 3 is a flow chart depicting steps of a method of providing short-circuit protection non-intrusively to a power supply or power source.

Referring now to FIG. 3, there is shown a method 300 for providing non-intrusive short-circuit protection to a power supply device. In the first step 302, 304, a voltage, equal to the input voltage minus drop across a first, non-ideal reference diode, and as described above, the input voltage minus the voltage drop across a second, load current-carrying, non-ideal diode, are provided to the non-inverting and inverting inputs of the same voltage comparator accordingly.

Those of ordinary skill in the art know that the output of a voltage comparator has two possible states or values, depending upon the difference between the input voltages. At step 306, the difference between the two voltages is effectively determined by the comparator. At step 308, the difference between the voltage drops will cause the output of the comparator to change state with the decision at step 308 resulting in the disconnection of the power source at step 310 or a continued monitoring of the voltage drops across the two diodes, as indicated by the negative output 312 of step 308.

Those of ordinary skill in the art should recognize that the power source depicted in FIG. 2 is a battery. It provides a direct-current output with a non-zero voltage, typically about 13 volts.

In the preferred embodiment, the switching device is a transistor but could also be an electromagnetic or solid-state relay.

Those of ordinary skill in the art should also recognize that the ratios of the resistors that comprise the two voltage dividers determine when the state of the voltage comparator will change responsive to voltage drops across the load current-carrying diode 232. Small capacitors coupled across the resistors of the voltage dividers determine the response time of the device assuring that the output of the comparator is either a low or a high depending upon the load current value. The time constants are thus selected according to the particular implementation of the circuit described above and depicted in FIG. 2.

In the preferred embodiment, the comparator as shown in FIG. 2 is preferably a conventional operational amplifier. In an alternate embodiment, however, the comparator function can be readily provided by a suitably programmed microprocessor or micro-controller, omitted from FIG. 2 for brevity because the capabilities of such devices are well known to those of ordinary skill in the art.

The foregoing description is for purposes of illustration only. The true scope of the invention is set forth in the following claims.

What is claimed is:

1. A method of protecting a power source, having an output voltage, from a short circuit, the method comprising:
   providing to a first input of a voltage comparator, a power source voltage minus a voltage drop across a first, forward-biased, non-ideal diode carrying electric current from the power source to a load;
   providing to a second input of the voltage comparator, the power source voltage minus a voltage drop across a second, forward-biased, non-ideal diode, which is also coupled to the power source and which carries a reference current, to a second input of the voltage comparator; and
   providing a control voltage signal, which is output from the voltage comparator, to a switching device located between the power source and the first forward-biased non-ideal diode, the control voltage signal and switching device being selected and configured to disconnect the power source when a power supply voltage drop across the first forward-biased, non-ideal diode exceeds a predetermined threshold relative to a power supply voltage drop across the second forward-biased, non-ideal diode.

2. The method of claim 1, wherein the second, forward-biased, non-ideal diode serves for thermal compensation of the voltage drop across the first, forward-biased, non-ideal diode carrying electric current from the power source to the load.

3. The method of claim 1, wherein the power source is a source of direct current having a non-zero output voltage greater than zero volts.

4. The method of claim 1, wherein the switching device is a transistor.

5. The method of claim 1, wherein first and second non-ideal diodes each comprise a junction between an N-type semiconductor material and a P-type semiconductor material and wherein the junction has a non-zero resistance when it is forward biased.

6. The method of claim 5, wherein the non-zero resistance is non-linear.

7. A non-intrusive short circuit protection apparatus for a power supply device, the apparatus comprising:

a voltage comparator having first and second inputs and an output;

a first, non-ideal diode having an anode coupled to the power supply device and a cathode coupled to a load requiring electric current, the cathode being additionally coupled to the first input of the voltage comparator, the first non-ideal diode carrying the electric current required by the load;

a second, non-ideal diode having an anode coupled to the power supply device and a cathode coupled to the second input of the voltage comparator; and a switching device having an input terminal, an output terminal and a control signal terminal, the switching device input terminal being coupled to the power supply device, the switching device output terminal being coupled to the anodes of both the first and second non-ideal diodes, the control signal terminal being coupled to the output of the voltage comparator;

wherein a voltage signal provided to the control signal terminal of the switching device from the output of the voltage comparator causes the switching device to disconnect the power supply device from the first diode when a difference between a first cathode voltage and a second cathode voltage exceeds a first, predetermined threshold.

8. The apparatus of claim 7, wherein the power supply device provides direct current and has a non-zero output voltage.

9. The apparatus of claim 7, wherein the power supply device comprises a motor vehicle battery.

10. The apparatus of claim 7, wherein the voltage signal provided to the control signal terminal of the switching device from the output of the voltage comparator also causes the switching device to disconnect the power supply device from the second diode when the difference between the first cathode voltage and the second cathode voltage exceeds the first, predetermined threshold.

11. The apparatus of claim 7, further comprising a first voltage divider having an input node, an output node and a reference potential node, the input node being coupled to the anode of the first diode, the reference potential node being coupled to a reference potential for the apparatus, the output node being coupled to the first input of the voltage comparator, the first voltage divider having an output voltage that is provided to the voltage comparator and which determines an amount of current passing through the first diode at which the voltage comparator turns off the switching device.

12. The apparatus of claim 11, further comprising a second voltage divider having an input node, an output node and a reference potential node, the input node of the second voltage divider being coupled to the anode of the second diode, the reference potential node being coupled to the reference potential for the apparatus, the output node being coupled to the second input of the voltage comparator, the second voltage divider having an output voltage that is provided to the voltage comparator and which determines an amount of current passing through the first diode at which the voltage comparator turns off the switching device.

13. The apparatus of claim 12, further comprising a capacitor coupled across a resistor comprising the second voltage divider.

14. The apparatus of claim 7, wherein the switching device is a transistor.

15. The apparatus of claim 7, wherein the voltage comparator comprises a processor.

16. The apparatus of claim 7, wherein the first and second diodes have a non-linear, non-zero direct-current resistance when forward biased.

* * * * *